United States Patent [19]

Mason et al.

[11] 4,456,828

[45] Jun. 26, 1984

[54] OPTOELECTRONIC COUPLER HOUSING

[75] Inventors: Daniel W. Mason, Scottsdale; David W. Stevenson, Mesa, both of Ariz.

[73] Assignee: Motorola, Inc., Schaumburg, Ill.

[21] Appl. No.: 84,967

[22] Filed: Oct. 15, 1979

[51] Int. Cl.³ ............................................. G02B 27/00
[52] U.S. Cl. ...................................... 250/551; 250/239
[58] Field of Search ................. 250/239, 574, 575, 551

[56] References Cited

U.S. PATENT DOCUMENTS 2,916,624 12/1959 Angel et al. ................. 250/239 UX
3,289,002 11/1966 Goodman ...................... 250/239 X
3,511,227 5/1970 Johnson ....................... 250/575 UX
3,561,846 2/1971 Kingsland ...................... 250/239 X Primary Examiner—David C. Nelms
Attorney, Agent, or Firm—Paul F. Wille

[57] ABSTRACT

A housing for positioning a discrete optoelectronic emitter and a discrete optoelectronic sensor to function as a coupler. The same housing provides the option for either reflective or transmissive mode operation. The discrete devices are removable to permit substitutions of devices having differing characteristics.

2 Claims, 3 Drawing Figures

OPTOELECTRONIC COUPLER HOUSING

BACKGROUND AND SUMMARY

The utility of optoelectronic couplers has long been recognized, and various packaging schemes have been utilized for permanently juxtaposing an optical emitter and an optical sensor in order to provide electrical isolation between two or more electrical circuit paths in the coupler-isolator mode. Alternative package configurations comprise slots for interrupting the optical path (the slotted mode) or orienting the optical path of each device to a common external point where a reflector completes the optical path between the devices (the reflective mode). Such alternative packages are useful for example in position-sensitive trigger circuits.

Because of the multiplicity of user-required operating modes for optoelectronic couplers and because of the variety of devices which may be used for either the emitter or the sensor, a large inventory of package types is required to provide a variety of functions where dedicated packaging is used in the sense that both the individual devices and the mode are chosen a priori.

It is an object of the present invention to provide a housing for an optoelectronic pair which allows operation in at least two modes.

It is a further object of the invention to provide an optoelectronic coupler housing which allows the use of a separately-packaged emitter and detector.

It is yet a further object of the invention to provide a housing which allows replacement of either or both the optoelectronic devices.

In a housing in accordance with the present invention, a sensor and an emitter are semi-permanently juxtaposed to permit their use as a coupler-isolator or as a sensor operating in either the slotted or reflective modes. The individual, discretely-packaged, optoelectronic elements use standard packaging for minimum cost, and the housing constitutes a separate standard package for the optical pair. The emitter-sensor pair is oriented within the opaque housing to provide two non-collinear optical paths.

DETAILED DESCRIPTION

Figure 1:
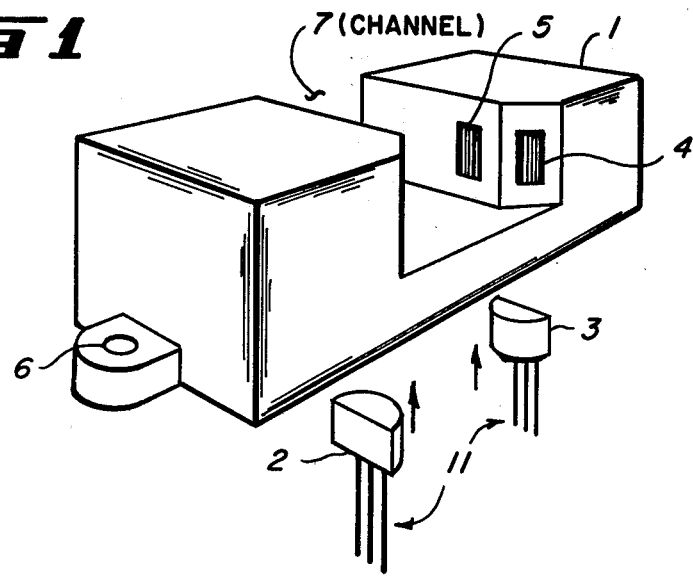
FIG. 1 is a perspective view of the housing showing exemplary discrete devices.
Figure 2:
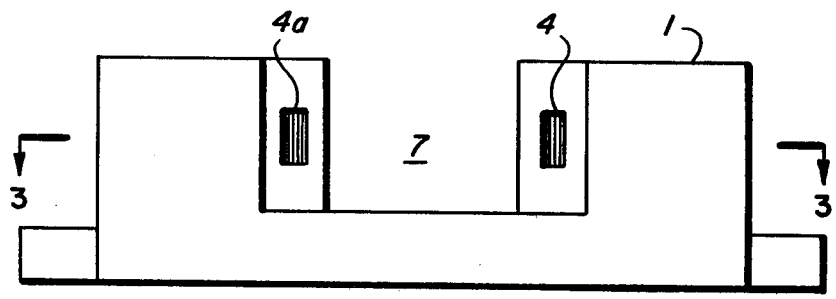
FIG. 2 is a front view of the housing showing the reflective mode windows.
Figure 3:
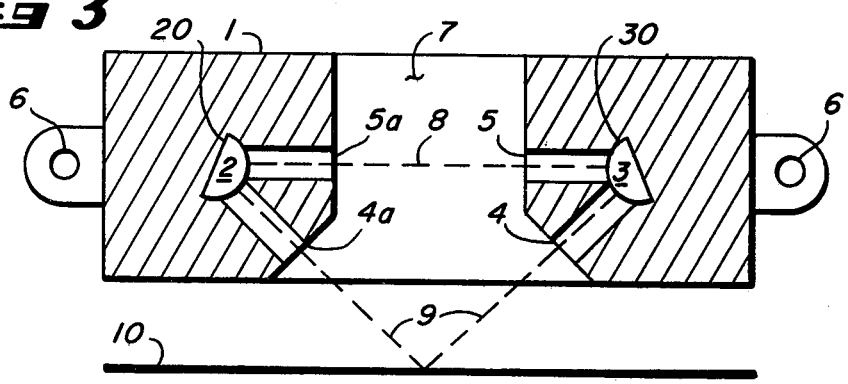
FIG. 3 is a cross section through the housing of FIG. 2 in the situs of the device-receptor cavities showing the windows enabling direct or reflective mode operation.

In FIG. 1, housing 1 of an optically opaque material has receptor cavities for holding a pair of separately packaged optoelectronic devices 2 and 3 capable of optical generation and detection. When device 3 is positioned in the receptor cavity in the housing, it may transmit or receive light through both housing windows 4 and 5 and the associated passages leading to the receptor cavity. A channel 7 in the housing permits interruption of the optical path by the insertion of an opaque object. FIGS. 2 and 3 give additional details of the housing. Because of the cross-sectional shape of cavities 20 and 30 the devices 2 and 3 are held in a predetermined position according to their directivity. Windows 4 and 4a provide for a non-collinear optical path 9 coupling devices 2 and 3 in receptor cavities 20 and 30 respectively; external reflector 10 completes the optical path 9. Windows 5 and 5a provide for a collinear optical path 8 between devices 2 and 3; this path may be defeated by an opaque object in the channel 7 of the housing where the reflective mode is desired e.g. where a reflector 10 is located in the non-collinear optical path. Alternatively, a movable opaque object in the channel 7 provides intermittent transmission in the collinear path 8 for operation in the slotted mode. A reflective cover (not shown) may enclose the channel to block the reflective path as well as ambient light for operation in the coupler-isolator mode. Optional mounting means 6 provide for mechanical attachment to housing support means, not shown.

In a preferred embodiment, the housing 1 is molded from an essentially opaque plastic material and is provided with receptor cavities 20 and 30 of semicircular cross section to receive devices 2 and 3 encapsulated by transparent or translucent plastic in the standard mechanical T0-92 package configuration. Integral detents may be provided for securing the optoelectronic devices. Channel 7 is desirably quite narrow along optical path 8 in order to maximize inter-device light transmission and minimize reception of extraneous light. Electrical leads 11 of devices 2 and 3 protrude from housing 1 in order to facilitate circuit connection to the devices. Those familiar with the plastic molding art will readily perceive how to form the housing 1 in accordance with the foregoing functional description.

There is thus obtained an inexpensive housing permitting selection of several modes of operation as well as selection of specific devices best suited to those modes or to particular requirements of the application, such as sensitivity, spectral response, latching or linear operation, etc.

In an alternative embodiment of the invention, the housing may be constructed from a plastic which transmits infra-red wavelengths corresponding to the emanations of the optical detector but which is essentially opaque to visible wavelengths. In this case, the windows and passages may be eliminated, and the mode-appropriate optical paths controlled by means of channels and/or holes.

While the inventive housing has been described by means of two embodiments, it will be obvious to one skilled in the art that alternative embodiments are within the scope of the invention. For example, either the collinear or non-collinear optical paths may be eliminated by elimination or plugging of the relevant optical passages. The windows could be blind holes selectively opened to provide the desired mode. The location of reflective element 10 could be determined by the edge of the housing or by suitable positioning means within the body itself, e.g., a channel or hole to receive a partially reflective rotatable shaft. The device positions could be predetermined to maximize transmission in the non-collinear path thereby eliminating the necessity for the collinear path for the coupler or slotted modes if a suitable reflector were positioned by means of the housing.

We claim:

1. A housing for at least a pair of separately-packaged optoelectronic devices including an optical emitter and an optical sensor comprising:
   a body containing receptor cavities for holding said emitter and said sensor in predetermined positions and providing at least two optical paths between said emitter and said sensor devices;

a first of said optical paths optically coupling said emitter and said sensor directly and a second of said optical paths being indirect and incomplete without reflective means external to said housing.

2. The housing of claim 1 further comprising channel means in said body generally transverse to said first optical path to permit interruption of said optical coupling.

* * * * *